(12) United States Patent
Naitoh et al.

(10) Patent No.: US 8,093,518 B2
(45) Date of Patent: Jan. 10, 2012

(54) SWITCHING ELEMENT RELYING ON NANOGAP ELECTRODES

(75) Inventors: Yasuhisa Naitoh, Tsukuba (JP); Masayo Horikawa, Tsukuba (JP); Hidekazu Abe, Fukuyama (JP); Tetsuo Shimizu, Tsukuba (JP); Wataru Mizutani, Tsukuba (JP); Shigeo Furuta, Tsukuba (JP); Masatoshi Ono, Tsukuba (JP); Tsuyoshi Takahashi, Tsukuba (JP)

(73) Assignees: National Institute of Advanced Industrial Science and Technology (JP); Funai Electric Advanced Applied Technology Research Institute, Inc. (JP)

( * ) Notice: Subject to any disclaimer, the term of this patent is extended or adjusted under 35 U.S.C. 154(b) by 239 days.

(21) Appl. No.: 11/992,883

(22) PCT Filed: Sep. 25, 2006

(86) PCT No.: PCT/JP2006/318993
§ 371 (c)(1), (2), (4) Date: Mar. 2, 2009

(87) PCT Pub. No.: WO2007/037210
PCT Pub. Date: Apr. 5, 2007

(65) Prior Publication Data
US 2009/0251199 A1    Oct. 8, 2009

(30) Foreign Application Priority Data

Sep. 27, 2005 (JP) ............................... 2005-280633
Jul. 10, 2006 (JP) ............................... 2006-189380

(51) Int. Cl.
*H01H 1/02* (2006.01)

(52) U.S. Cl. ............................ 200/267; 257/E27.111
(58) Field of Classification Search .................. 200/267, 200/181; 257/347, E27.111
See application file for complete search history.

(56) References Cited

U.S. PATENT DOCUMENTS

| 3,971,056 A | 7/1976 | Jaskolski et al. |
| 4,112,458 A * | 9/1978 | Jaskolski et al. ............... 257/108 |
| 4,814,943 A | 3/1989 | Okuaki |
| 5,208,693 A | 5/1993 | Arstein et al. |
| 5,339,211 A | 8/1994 | Pernisz et al. |
| 5,394,304 A | 2/1995 | Jones |
| 5,412,498 A | 5/1995 | Arstein et al. |

(Continued)

FOREIGN PATENT DOCUMENTS

DE    10 2005 009057    8/2006

(Continued)

OTHER PUBLICATIONS

Collier, Charles P., et al., "A [2]Catenane-Based Solid State Electronically Reconfigurable Switch", Science, vol. 289, Aug. 18, 2000, pp. 1172-1175 (in English).

(Continued)

*Primary Examiner* — Vanessa Girardi
(74) *Attorney, Agent, or Firm* — Harness, Dickey & Pierce, P.L.C.

(57) ABSTRACT

A switching element 100 includes an insulating substrate 10, a first electrode 20 provided on the insulating substrate 10, a second electrode 30 provided on the insulating substrate 10, and an interelectrode gap 40 provided between the first electrode 20 and the second electrode 30, a distance G between the first electrode 20 and the second electrode 30 being 0 nm<G≦50 nm.

20 Claims, 9 Drawing Sheets

Arrows indicate areas where interelectrode gap G is less than 50 nm

U.S. PATENT DOCUMENTS

| | | | |
|---|---|---|---|
| 5,736,758 A | 4/1998 | Salisbury | |
| 5,869,878 A | 2/1999 | Hasegawa | |
| 6,413,880 B1 * | 7/2002 | Baski et al. | 438/759 |
| 6,596,937 B2 | 7/2003 | Mazurkiewicz | |
| 6,614,102 B1 * | 9/2003 | Hoffman et al. | 257/666 |
| 6,635,914 B2 * | 10/2003 | Kozicki et al. | 257/296 |
| 6,699,779 B2 | 3/2004 | Chen et al. | |
| 6,700,172 B2 | 3/2004 | Ehmke et al. | |
| 6,803,534 B1 | 10/2004 | Chen et al. | |
| 6,897,009 B2 | 5/2005 | Johnson, Jr. et al. | |
| 6,998,333 B2 | 2/2006 | Chen et al. | |
| 7,002,441 B2 | 2/2006 | Pillans et al. | |
| 7,015,504 B2 | 3/2006 | Lyons et al. | |
| 7,138,331 B2 | 11/2006 | Park et al. | |
| 7,209,019 B2 | 4/2007 | Nakanishi et al. | |
| 7,348,591 B2 | 3/2008 | Yamauchi et al. | |
| 7,419,849 B2 | 9/2008 | Kumagai et al. | |
| 7,449,710 B2 | 11/2008 | Lung | |
| 7,541,227 B2 | 6/2009 | Mei et al. | |
| 7,902,586 B2 | 3/2011 | Naitoh et al. | |
| 8,022,383 B2 | 9/2011 | Naitoh et al. | |
| 2001/0000755 A1 | 5/2001 | Hirakata et al. | |
| 2002/0018881 A1 | 2/2002 | Terashita et al. | |
| 2002/0084736 A1 | 7/2002 | Shibata | |
| 2002/0089005 A1 | 7/2002 | Wickramasinghe et al. | |
| 2002/0175408 A1 | 11/2002 | Majumdar et al. | |
| 2003/0011740 A1 | 1/2003 | Tanaka et al. | |
| 2003/0016519 A1 | 1/2003 | Bachman | |
| 2003/0042834 A1 | 3/2003 | Dean et al. | |
| 2003/0180989 A1 | 9/2003 | Chen et al. | |
| 2003/0186167 A1 | 10/2003 | Johnson, Jr. et al. | |
| 2004/0214367 A1 | 10/2004 | Segal et al. | |
| 2005/0035367 A1 | 2/2005 | Bertin et al. | |
| 2005/0041466 A1 | 2/2005 | Rueckes et al. | |
| 2005/0062070 A1 | 3/2005 | Bertin et al. | |
| 2005/0136419 A1 | 6/2005 | Lee | |
| 2005/0237781 A1 * | 10/2005 | Bertin et al. | 365/145 |
| 2005/0280436 A1 | 12/2005 | Bertin | |
| 2006/0102927 A1 | 5/2006 | Fujita et al. | |
| 2006/0278879 A1 | 12/2006 | Busta | |
| 2007/0045691 A1 | 3/2007 | Chang et al. | |
| 2007/0284610 A1 * | 12/2007 | Kawaura et al. | 257/146 |
| 2008/0135386 A1 | 6/2008 | Bozler et al. | |
| 2008/0315184 A1 * | 12/2008 | Furuta et al. | 257/30 |
| 2009/0020399 A1 | 1/2009 | Kim et al. | |
| 2009/0020742 A1 | 1/2009 | Sunamura et al. | |
| 2009/0161407 A1 * | 6/2009 | Masuda et al. | 365/148 |
| 2009/0251199 A1 | 10/2009 | Naitoh et al. | |
| 2011/0108399 A1 * | 5/2011 | Furuta et al. | 200/181 |

FOREIGN PATENT DOCUMENTS

| | | |
|---|---|---|
| JP | 10-255481 | 9/1998 |
| JP | 2001-525606 | 12/2001 |
| JP | 2004-259748 A | 9/2004 |
| JP | 2004-306208 | 11/2004 |
| JP | 2005-079335 | 3/2005 |
| JP | 2005-079335 A | 3/2005 |
| JP | 2005-175164 | 6/2005 |
| JP | 2005-175164 A | 6/2005 |
| JP | 2006-128438 | 5/2006 |
| JP | 2006-134954 | 5/2006 |
| JP | 2006-231432 | 9/2006 |
| JP | 2006-234799 | 9/2006 |
| JP | 2006-324447 | 11/2006 |
| JP | 2007-123828 | 5/2007 |
| WO | 99-28914 | 6/1999 |

OTHER PUBLICATIONS

Terabe, K., et al. "Quantized conductance atomic switch", Letters to Nature, Nature, vol. 433, Jan. 6, 2005, pp. 47-50 (in English).

International Search Report for PCT/JP2006/318993, mailed Dec. 19, 2005; ISA/JPO (in English).

Yasuhisa Naitoh et al., "Resistance Switch Employing a Simple Metal Nanogap Junction", Nanotechnology Research Institute, National Institute of Advanced Industrial Science and Technology, vol. 17, No. 22, Nov. 28, 2006, pp. 5669-5674.

Hongkun Park et al., "Fabrication of Metallic Electrodes With Nanometer Separation by Electromigration", Applied Physics Letters, American Institute of Physics, Melville, NY, vol. 75, No. 2, Jul. 12, 1999, pp. 301-303.

Collier, Charles P. et al., "1 [2]Catenane-Based Solid State Electronically Reconfigurable Switch", Science Magazine, Aug. 18, 2000, vol. 289, pp. 1172-1175.

Terabe, K. et al., "Quantized Conductance Atomic Switch", Nature Publishing Group, vol. 433, Jan. 2005, pp. 47-50.

Notification of Reasons for Refusal for corresponding Japanese Application No. 2006-189380 mailed Sep. 21, 2011 with partial English translation (6 pages).

* cited by examiner 100 nm

Arrows indicate areas where interelectrode gap G is less than 50 nm

SWITCHING ELEMENT RELYING ON NANOGAP ELECTRODES

CROSS-REFERENCE TO RELATED APPLICATIONS

This application is a U.S. National Stage Application of International application No. PCT/JP2006/318993, filed Sep. 25, 2006 and published in Japanese as WO 2007/037210 A1 on Apr. 5, 2007. This application claims the benefit of Japanese Application Nos. 2005-280633, filed Sep. 27, 2005 and 2006-189380, filed Jul. 10, 2006. The disclosures of the above applications are incorporated herein by reference.

TECHNICAL FIELD

The present invention relates to a switching element using nanogap metal electrodes.

BACKGROUND ART

A further reduction in size of electric elements has been desired along with a reduction in size and an increase in density of devices. A nanostructure represented by functional organic molecules and nanoparticles has been extensively studied. It is considered to be effective to utilize the properties of the nanostructure for electric elements in order to reduce the size of the elements. Therefore, extensive studies on the nanostructure have been conducted by research institutes, companies, and the like. For example, an element has attracted attention which utilizes two electrodes separated by a minute gap (such a pair of electrodes may be hereinafter referred to as "nanogap electrodes") and the gap is filled with functional organic molecules. For example, Science, 289 (2000) 1172 to 1175 discloses an element catenane molecules are disposed in the gap between nanogap electrodes formed using platinum. This document describes that the catenane molecules undergo an oxidation-reduction reaction by applying a voltage between the electrodes to enable a switching operation.

As the nanogap electrodes, an element in which the gap is filled with nanoparticles has also attracted attention. For example, Nature, 433 (2005) 47 to 50 discloses an element in which nanogap electrodes are formed using silver sulfide and platinum and silver particles are disposed in the gap between the electrodes. According to this document, when a voltage is applied between the electrodes, the silver particles expand or contract due to an electrochemical reaction so that the electrodes can be connected or disconnected to enable a switching operation.

The above-mentioned switching elements require that special synthetic molecules or a complicated metal complex is disposed between the nanogap electrodes. Since these switching elements have a mechanism which utilizes an intramolecular chemical reaction or a reaction between different atoms, these switching elements have dependence on the direction of the applied voltage. This limits utilization of these switching elements. Moreover, since a chemical reaction is utilized for a switching operation, the element tends to deteriorate.

When forming the above-mentioned switching elements, it is difficult to sufficiently reduce the gap between the nanogap electrodes. JP-A-2005-79335 discloses a method of producing nanogap electrodes in which the gap between the nanogap electrodes is reduced, for example.

DISCLOSURE OF THE INVENTION

An object of the invention is to provide a nonvolatile switching element which has a very simple structure and can perform stable and repeated switching operations.

A switching element according to the invention comprises:
an insulating substrate;
a first electrode provided on the insulating substrate;
a second electrode provided on the insulating substrate; and
an interelectrode gap provided between the first electrode and the second electrode, a distance G between the first electrode and the second electrode being 0 nm<G≦50 nm.

This configuration makes it possible to provide a nonvolatile switching element which has a very simple structure and can stably and repeatedly perform switching operations.

In the invention, the distance G refers to the shortest distance between the first electrode and the second electrode in the interelectrode gap.

In the switching element according to the invention, the distance G between the first electrode and the second electrode may be 0.1 nm≦G≦20 nm.

The switching element according to the invention may further comprise a sealing member which includes at least the interelectrode gap.

In the switching element according to the invention, a pressure inside the sealing member may be $2\times10^5$ Pa or less.

In the switching element according to the invention, a material for the first electrode may be at least one material selected from gold, silver, platinum, palladium, nickel, aluminum, cobalt, chromium, rhodium, copper, tungsten, tantalum, carbon, and alloys thereof.

In the switching element according to the invention, a material for the second electrode may be at least one material selected from gold, silver, platinum, palladium, nickel, aluminum, cobalt, chromium, rhodium, copper, tungsten, tantalum, carbon, and alloys thereof.

In the switching element according to the invention, at least one of the first electrode and the second electrode may have a multilayer structure.

In the switching element according to the invention, a resistance between the first electrode and the second electrode may be 1 kilohm to 1 megaohm when the switching element is turned ON, and may be 1 megaohm to 100 teraohms when the switching element is turned OFF.

BRIEF DESCRIPTION OF THE DRAWINGS

FIG. 9A is a photograph and FIG. 9B is a simplified illustration.

BEST MODE FOR CARRYING OUT THE INVENTION

Examples of preferred embodiments of the invention are described below with reference to the drawings.

1. Switching Element

Figure 1:
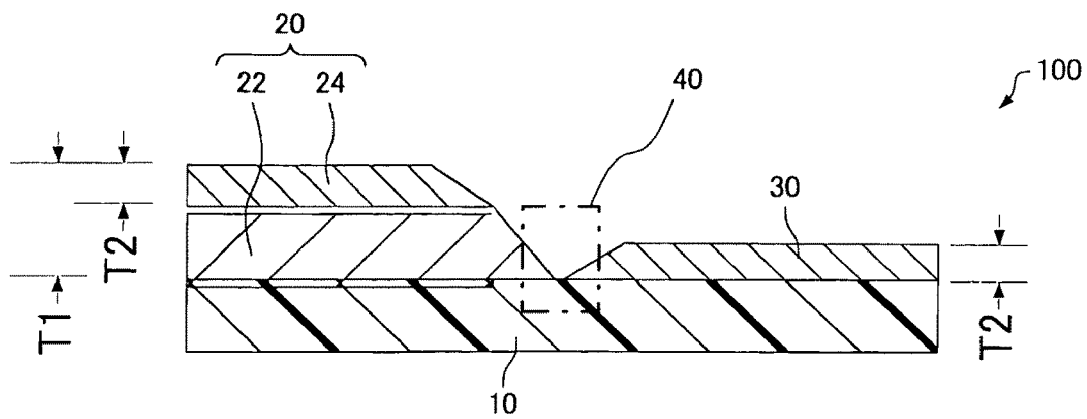
FIG. 1 is a cross-sectional view schematically showing the main portion of a switching element 100 according to one embodiment of the invention.
Figure 2:
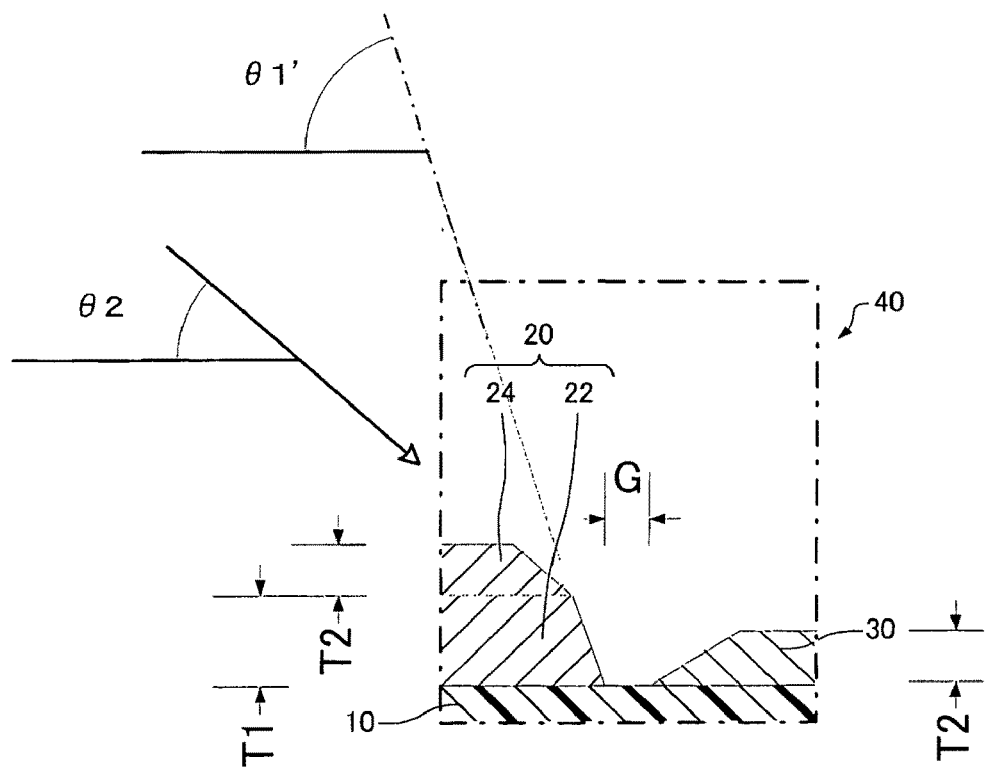
FIG. 2 is an enlarged cross-sectional view schematically showing the main portion of a switching element 100 according to one embodiment of the invention.
Figure 3:
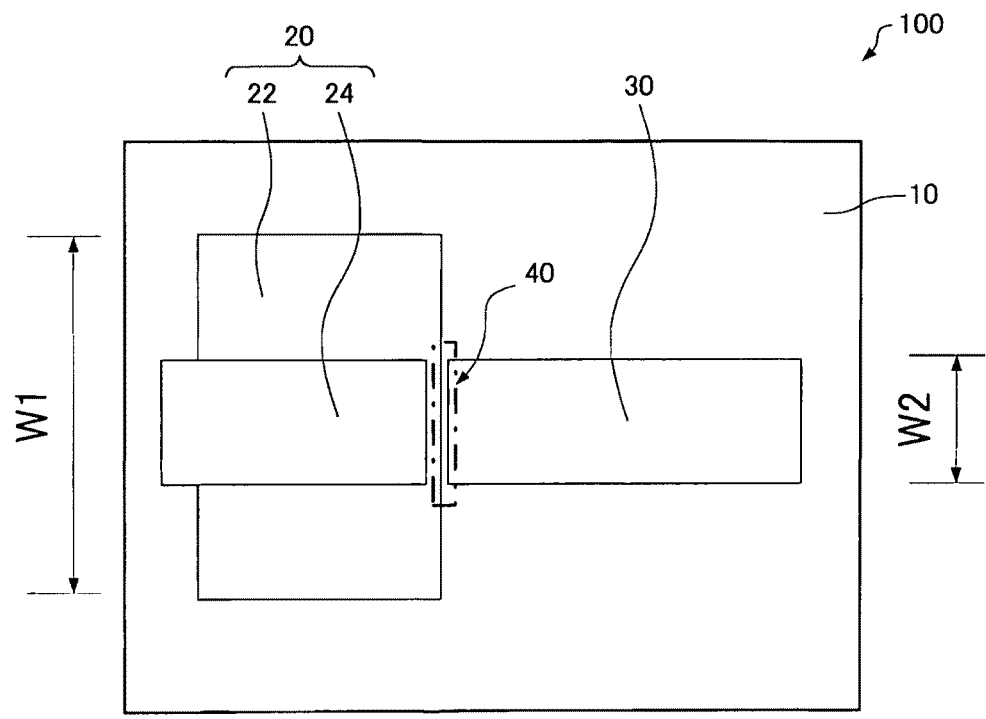
FIG. 3 is a plan view schematically showing a switching element 100 according to one embodiment of the invention.
Figure 4:
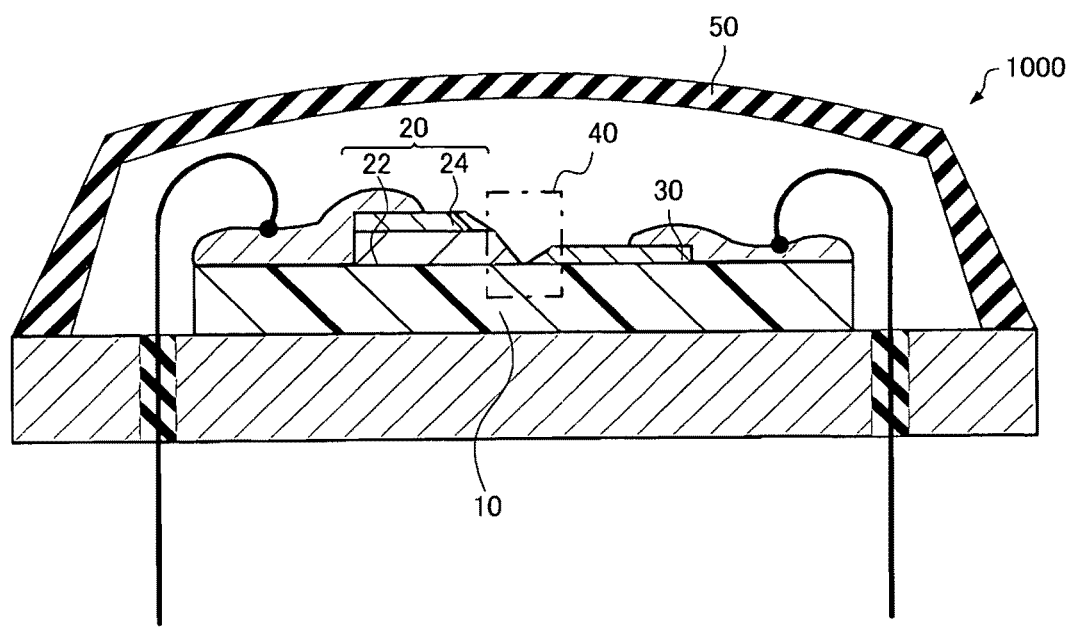
FIG. 4 is a schematic view showing a switching device 1000 formed by providing a sealing member over a switching element 100 according to one embodiment of the invention.

FIG. 1 is a cross-sectional view schematically showing the main portion of a switching element 100 according to one embodiment of the invention. FIG. 2 is an enlarged cross-sectional view schematically showing the main portion of the switching element 100. FIG. 3 is a plan view schematically showing the main portion of the switching element 100 according to this embodiment. FIG. 4 is a schematic view showing an example in which a sealing member is provided over the switching element 100 to form a switching device 1000.

The switching element 100 according to this embodiment includes an insulating substrate 10, a first electrode 20 provided on the insulating substrate 10, a second electrode 30 provided on the insulating substrate 10, and an interelectrode gap 40 provided between the first electrode 20 and the second electrode 30, wherein a distance G between the first electrode 20 and the second electrode 30 is $0\ \text{nm} < G \leq 50\ \text{nm}$.

The insulating substrate 10 has a function of a support which allows the two electrodes 20 and 30 of the switching element 100 to be provided at an interval. The structure and the material for the insulating substrate 10 are not particularly limited insofar as the insulating substrate 10 exhibits insulating properties. For example, the surface of the insulating substrate 10 may be flat, or may have elevations or depressions. For example, a substrate produced by forming an oxide film or the like on the surface of a semiconductor substrate (e.g., Si substrate) may be used as the insulating substrate 10. The insulating substrate 10 may be an insulating substrate on which an oxide film or the like is not formed. As the material for the insulating substrate 10, glass, an oxide such as silicon oxide ($SiO_2$), or a nitride such as silicon nitride ($Si_3N_4$) is suitably used. In particular, silicon oxide ($SiO_2$) is preferable as the material for the insulating substrate 10 from the viewpoint of adhesion to the electrodes 20 and 30 described later and an increased degree of freedom relating to production.

The first electrode 20 is provided on the insulating substrate 10. The first electrode 20 is one electrode of the switching element 100, and makes a pair with the second electrode 30 described later to enable a switching operation. The shape of the first electrode 20 is arbitrary. It is desirable that at least a lateral dimension (width) W1 (see FIG. 3) of a portion of the first electrode 20 which faces the second electrode 30 be in the range of $5\ \text{nm} \leq W1$. A thickness T1 of the first electrode 20 (see FIGS. 1 and 2) is arbitrary. It is desirable that the thickness T1 be in the range of $5\ \text{nm} \leq T1$ in a state in which the second electrode 30 is formed. FIGS. 1 and 2 illustrate an example in which the first electrode 20 includes a first electrode lower portion 22 and a first electrode upper portion 24 for convenience of description relating to production steps described later. It is preferable that the material for the first electrode 20 be at least one material selected from gold, silver, platinum, palladium, nickel, aluminum, cobalt, chromium, rhodium, copper, tungsten, tantalum, carbon, and alloys thereof. Different metals may be used in layers in order to increase adhesion to the insulating substrate 10. For example, the first electrode 20 may have a stacked structure of chromium and gold.

The second electrode 30 is provided on the insulating substrate 10. The second electrode 30 is the other electrode of the switching element 100, and makes a pair with the first electrode 20 to enable a switching operation. The shape of the second electrode 30 is arbitrary. It is desirable that at least a lateral dimension (width) W2 (see FIG. 3) of a portion of the second electrode 30 which faces the first electrode 20 be in the range of $5\ \text{nm} \leq W2 \leq W1$. A thickness T2 of the second electrode 30 is arbitrary. It is desirable that the thickness T2 be in the range of $5\ \text{nm} \leq T2 \leq T1$ from the viewpoint of the strength of the electrode and the peel strength from the support. It is preferable that the material for the second electrode 30 be selected from gold, silver, platinum, palladium, nickel, aluminum, cobalt, chromium, rhodium, copper, tungsten, tantalum, carbon, and alloys thereof. Different metals may be used in layers in order to increase adhesion to the insulating substrate 10. For example, the second electrode 30 may have a stacked structure of chromium and gold.

The interelectrode gap 40 is provided so that the distance G between the first electrode 20 and the second electrode 30 is $0\ \text{nm} < G \leq 50\ \text{nm}$ (e.g., $0.1 \leq \text{nm} \leq G\ 20\ \text{nm}$) (see FIG. 2). The distance G is more preferably $0.1\ \text{nm} \leq G \leq 10\ \text{nm}$. The interelectrode gap 40 has a function of causing a switching phenomenon of the switching element 100. The closest interelectrode portion may be formed at one or more locations in a region in which the first electrode 20 faces the second electrode 30. If the distance G exceeds 50 nm, an electric field for the movement of metal elements becomes insufficient, and therefore the switching element 100 may not be operated. If the distance G is 0 nm, the first electrode 20 and the second electrode 30 are short-circuited. The lower limit may be referred to as the minimum distance at which a tunneling current may occur, although determination based on microscopy measurement is difficult. Specifically, the lower limit is a theoretical value of the distance at which current-voltage characteristics do not follow Ohm's law when the element operates and a quantum-mechanical tunneling effect is observed.

A sealing member 50 may be provided to include at least the interelectrode gap 40. It is desirable that the sealing member 50 enclose the entire element including the insulating substrate 10. The sealing member 50 has a function of preventing the interelectrode gap 40 from contacting the atmosphere. The shape of and the material for the sealing member 50 are arbitrary insofar as the sealing member 50 has the above function. The sealing member 50 allows the switching element 100 to operate more stably. As the material for the sealing member 50, a known semiconductor sealing material may be used. A gas barrier layer or the like formed of a known substance may be provided, if necessary. When the entire nanogap electrodes are placed in an appropriate vacuum chamber and used as a switching element, the sealing member 50 may be omitted.

The inside of the sealing member 50 may be under reduced pressure, or may be filled with various substances. The pressure inside the sealing member 50 may be set at $2 \times 10^5$ Pa or less. More preferably, a pressure P inside the sealing member 50 or inside a vacuum chamber in which the nanogap electrodes are placed is set at $10^{-9}$ Pa<P<$2 \times 10^5$ Pa. The inside of the sealing member 50 may be filled with an inert gas such as dry air, nitrogen, or rare gas or an electrically inert organic solvent such as toluene.

2. Method of Producing Switching Element

A method of producing the switching element 100 may include the following steps.

Specifically, the method of producing the switching element 100 includes (1) a step of providing the insulating substrate 10, (2) a first resist pattern formation step, (3) a first deposition step, (4) a first lift-off step, (5) a second resist pattern formation step, (6) a second deposition step, (7) a second lift-off step, (8) an electric field separation step, and (9) a sealing step. The following description is given taking an example in which the first electrode 20 includes the first electrode lower portion 22 and the first electrode upper portion 24 for convenience of description relating to the production steps. The reference numerals are provided in the same manner as in FIG. 1.

Figure 5:
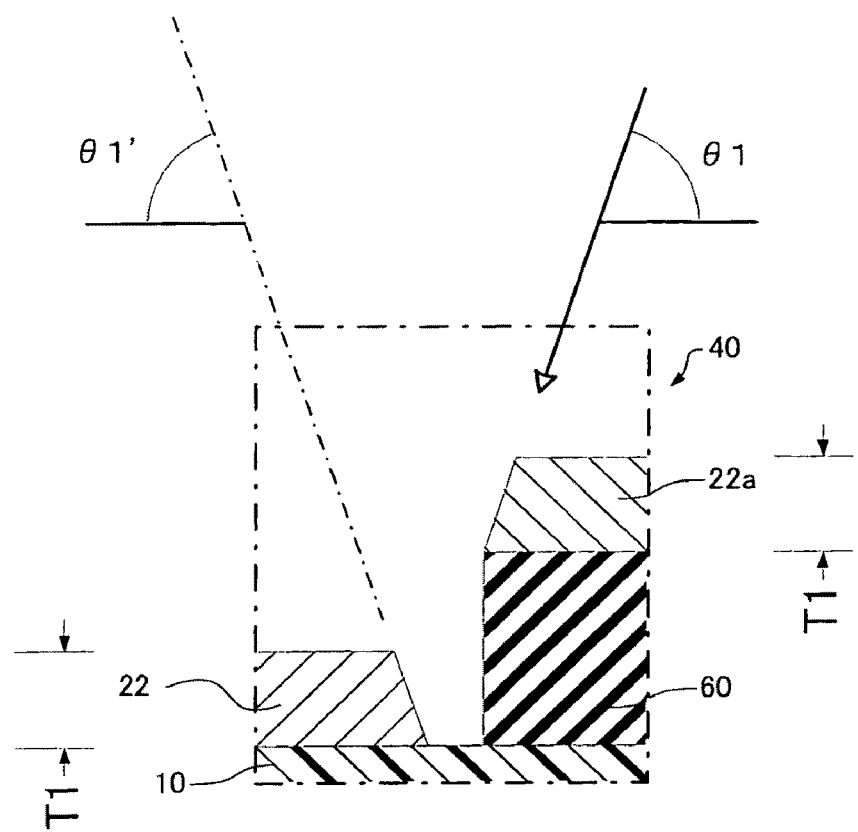
FIG. 5 is a cross-sectional view schematically showing a first deposition step in a production process of a switching element 100 according to one embodiment of the invention.
Figure 6:
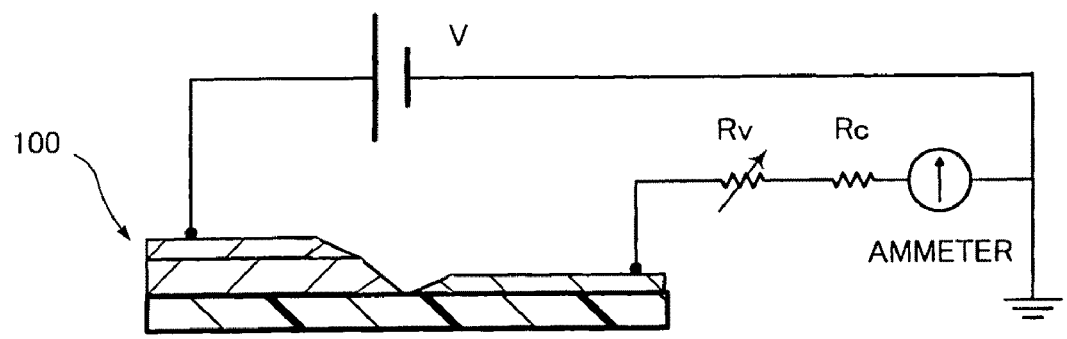
FIG. 6 is a circuit diagram schematically showing a circuit used in an electric field separation step in a production process of a switching element 100 according to one embodiment of the invention.

These steps are disclosed in JP-A-2005-79335. The nanogap electrodes may also be produced using a method disclosed in JP-A-2004-259748 or JP-A-2005-175164. In this embodiment, the switching element 100 is produced in accordance with the method disclosed in JP-A-2005-79335. The steps are described below with reference to FIGS. 1 to 6. FIG. 5 is a schematic view illustrative of the first deposition step. FIG. 6 is a schematic view showing a circuit formed in the electric field separation step.

(1) Step of Providing Insulating Substrate 10

As the insulating substrate 10, a commercially-available glass substrate, an Si substrate provided with an oxide film, or another substrate having an insulating surface may be used. When using a conductive substrate such as an Si substrate, a desired insulating film may be formed on the surface of the conductive substrate using a known method such as a heat treatment, an oxidation treatment, deposition, or sputtering, and the resulting substrate may be used as the insulating substrate 10.

(2) First Resist Pattern Formation Step

A resist pattern 60 for forming the first electrode lower portion 22 is formed on the insulating substrate 10 using a known method such as photolithography. The thickness of the resist pattern 60 is arbitrary insofar as the function of the resist pattern 60 is not impaired. For example, the thickness of the resist pattern 60 may be set at 1 micrometer.

(3) First Deposition Step

The first electrode lower portion 22 is formed by the first deposition step. This step may be carried out using a known deposition device. The insulating substrate 10 is disposed so that the deposition target surface is inclined when viewed from a deposition source. As shown in FIG. 5, when the angle formed by the deposition target surface and a travel direction of particles evaporated from the deposition source is referred to as $\theta 1$, the insulating substrate 10 is disposed so that $0°<\theta 1<90°$ is satisfied (this deposition method is hereinafter referred to as "oblique deposition"). As a result, the first electrode lower portion 22 is formed in such a shape that the end face inclines, as shown in FIG. 5. The angle formed by the inclination of the end face of the first electrode lower portion 22 and the surface of the substrate 10 is referred to as $\theta 1'$. The angle $\theta 1'$ may be changed by adjusting the shape of the resist pattern 60, the metal deposition properties of the surface of the substrate 10, the angle $\theta 1$, and the like. The elements can be formed with high reproducibility when the conditions are identical. Therefore, the angle $\theta 1'$ can be determined by measuring the deposition results under identical conditions.

It is preferable to increase the distance between the deposition source and the deposition target surface during deposition since the parallelism of the deposition line increases. The distance between the deposition source and the deposition target surface varies depending on the deposition device used. Deposition necessary for this embodiment can be performed when the distance between the deposition source and the deposition target surface is about 500 mm or more. In the first deposition step, a material selected from gold, silver, platinum, palladium, nickel, aluminum, cobalt, chromium, rhodium, copper, tungsten, tantalum, carbon, and alloys thereof is deposited one or more times. A plurality of deposition operations may be performed to form a two-layer structure such as depositing chromium and then depositing gold. The thickness of the first electrode lower portion 22 obtained by the first deposition step is arbitrary insofar as electric conductivity can be achieved. For example, when selecting gold as the material for the first electrode lower portion 22, the thickness of the first electrode lower portion 22 may be set at 5 nm or more.

(4) First Lift-Off Step

The first lift-off step is carried out using a known method. In this step, a stripper suitable for the material for the resist pattern 60 is used. This step causes the first electrode lower portion 22 to be formed while removing a sacrifice electrode 22a formed on the resist pattern 60 (see FIG. 5).

(5) Second Resist Pattern Formation Step

A second resist pattern is formed using a known method such as photolithography. A resist pattern (not shown) for forming the second electrode 30 and the first electrode upper portion 24 is formed by this step. An opening in the resist pattern is formed to cross the end (portion which serves as one of the nanogap electrodes) of the first electrode lower portion 22 obtained by the above step. The thickness of the resist pattern is arbitrary.

(6) Second Deposition Step

The second electrode 30 is formed by the second deposition step. The first electrode upper portion 24 is formed when forming the second electrode 30 (see FIG. 2). This step may be carried out using a known deposition device. This step is carried out using oblique deposition. As shown in FIG. 2, when the angle formed by the deposition target surface and a travel direction of particles evaporated from the deposition source is referred to as $\theta 2$, the insulating substrate 10 is disposed so that $0°<\theta 2<\theta 1'<90°$ is satisfied when $\theta 1'<90°$, and $0°<\theta 2<90°$ is satisfied when $90°\leq\theta 1'$. The end (i.e., portion which faces the first electrode 20) of the second electrode 30 is formed by this step. The first electrode upper portion 24 is also formed by this step. It is preferable to increase the distance between the deposition source and the deposition target surface during deposition since the parallelism of the travel path of the deposition particles increases in the same manner as in the first deposition step. The distance between the deposition source and the deposition target surface varies depending on the device used. Deposition can be performed without causing a problem when the distance between the deposition source and the deposition target surface is about 500 mm or more. In the second deposition step, a material selected from gold, silver, platinum, palladium, nickel, aluminum, cobalt, chromium, rhodium, copper, tungsten, tantalum, carbon, and alloys thereof is deposited one or more times.

The interelectrode gap 40 is formed utilizing the shadow of the first electrode lower portion 22 formed by deposition particles during oblique deposition in the second deposition step. Therefore, an interelectrode gap 40 having a desired electrode-to-electrode distance G can be obtained by adjusting at least one of the thickness of the first electrode lower portion 22 and the oblique deposition angle θ2 in the second deposition step. Therefore, it is desirable that the thickness of the second electrode 30 obtained by the second deposition step be smaller than the thickness of the first electrode 20.

(7) Second Lift-Off Step

The second lift-off step is carried out using a known method. In this step, a stripper suitable for the material of the resist pattern is used. This causes the first electrode 20 and the second electrode 30 to be formed, whereby nanogap electrodes are obtained.

(8) Electric Field Separation Step

The nanogap electrodes thus obtained may be short-circuited. Therefore, this step may be carried out, if necessary. The electric field separation step may be carried out using a method described in Appl. Phys. Lett., 75 (1999) 301. FIG. 6 is a schematic view showing a circuit when performing the electric field separation step. A variable resistor Rv, a fixed resistor Rc, and a power supply are connected in series with the short-circuited electrodes. The fixed resistor Rc is provided to prevent a situation in which a current in an amount equal to or larger than the desired amount flows to break the electrodes. The amount of current necessary for separating the electrodes is several to several tens of milliamperes (mA). The resistance of the variable resistor Rv is slowly reduced from the initial value (high resistance) and the adjustment is stopped when the flow of current has stopped, whereby nanogap electrodes (i.e., switching element 100) having a desired electrode-to-electrode distance G can be obtained.

(9) Sealing Step

This step is carried out using known hermetic seal technology. This step may be carried out with ceramic sealing, glass sealing, plastic sealing, or metal cap sealing, and may be also be carried out in a desired atmosphere.

3. Effects

The switching element 100 according to this embodiment has a very simple structure and can perform stable and repeated switching operations. Specifically, the switching element 100 according to this embodiment has a very simple structure in which the switching element 100 includes only the nanogap electrodes and does not require other organic molecules or inorganic particles. Since the switching element 100 according to this embodiment does not include a substance which deteriorates, the switching element 100 can stably perform repeated switching operations. Moreover, the switching element 100 according to this embodiment is non-volatile.

4. Switching Operation

Figure 7:
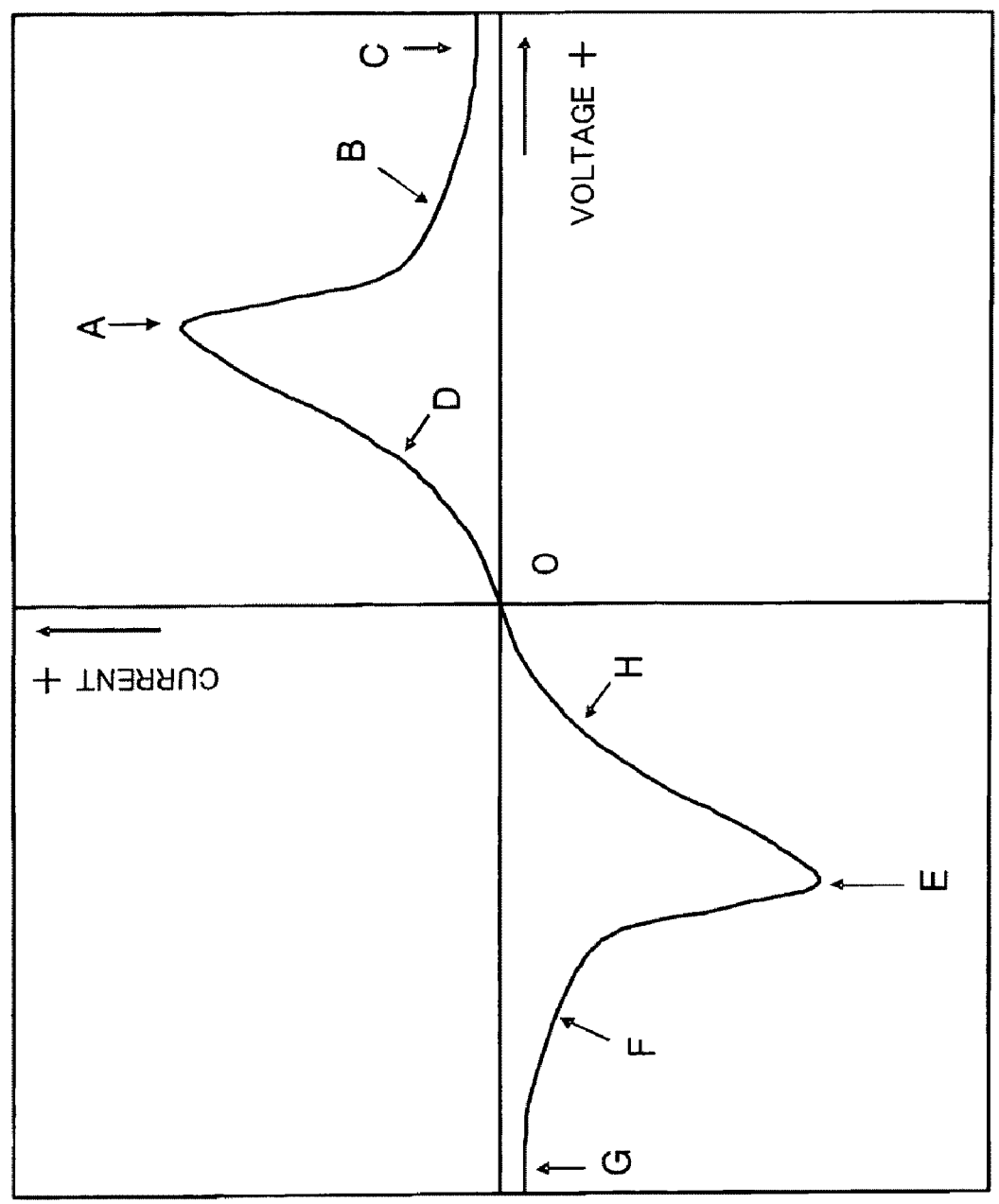
FIG. 7 is a graph schematically showing an example of a current-voltage curve of a switching element including nanogap electrodes.
Figure 8:
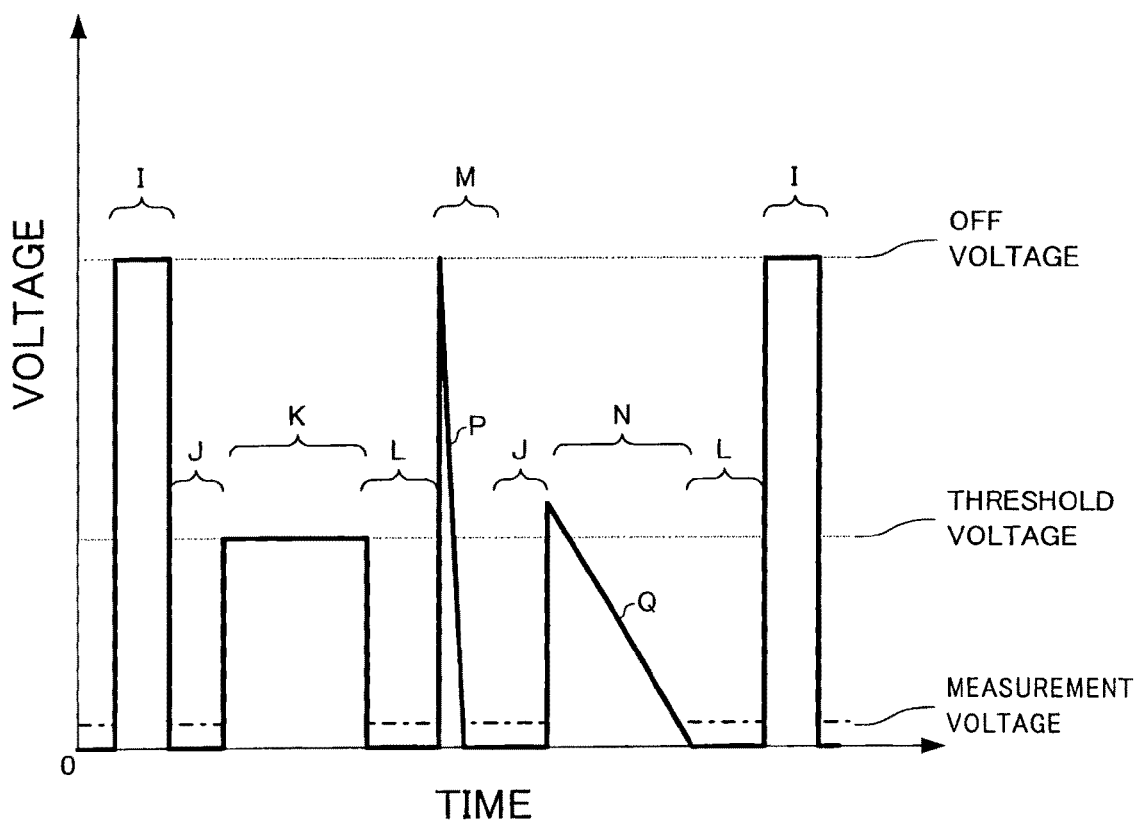
FIG. 8 is a graph schematically showing an example of a voltage sequence of a switching element including nanogap electrodes.

An example of the operation of the switching element 100 according to this embodiment is described below. FIG. 7 schematically shows an example of a current-voltage curve of the switching element 100. In FIG. 7, the horizontal axis indicates a voltage applied between the nanogap electrodes of the switching element 100, and the vertical axis indicates current. FIG. 7 contains symbols A to H and 0 for convenience. FIG. 8 schematically shows the sequence of the voltage applied between the nanogap electrodes of the switching element 100. In FIG. 8, the horizontal axis indicates the elapsed time, and the vertical axis indicates the applied voltage.

As shown in FIG. 7, since the current-voltage curve of the switching element 100 is symmetrical with respect to the point 0, the voltage applied to the switching element 100 and the current do not depend on the polarity of the switching element 100. The following description focuses on the right portion (i.e., voltage is positive) of FIG. 7. Description of the portion in which the voltage is negative is omitted. The switching operation relating to the portion in which the voltage is negative corresponds the case where the polarity is reversed. In the region shown in FIG. 7 which passes through the point B between the point A (voltage when the resistance is minimum) and the C point, the switching element 100 shows a negative resistance effect whereby the resistance increases as the applied voltage increases. In this region, the state of the switching element 100 changes depending on the applied voltage. This voltage region is hereinafter referred to as a transition region. When the voltage in the transition region is instantaneously changed to a value around the point 0 (value between the point A and the E point in practice) (the operation of instantaneously changing the voltage to a value around the point 0 is hereinafter referred to as "voltage-cut operation"), the resistance corresponding to the voltage applied to the element immediately before cutting the voltage can be obtained. The resistance of the element decreases as the voltage in the transition state which determines the resistance is set closer to the point A, and decreases as the voltage is set to be higher than the point A (the voltage dependence of the resistance in the transition region is described later in "5. Examples" with reference to FIG. 14). The point B in the transition region indicates a point at which an intermediate state between a state in which the resistance is low (hereinafter referred to as "ON state") and a state in which the resistance is high (hereinafter referred to as "OFF state") after the voltage-cut operation. The voltage at the low-voltage-side edge (around the point A) of the transition region is referred to as a threshold voltage. A value around the point A is defined as the threshold value because the threshold value (i.e., voltage at which the minimum element resistance can be obtained in the transition region) does not necessarily coincide with the point A shown in FIG. 7 and may differ to some extent from the point A depending on the operating voltage, the measurement environment, and the like.

An example of a method of operating the switching element 100 is described below. A state J in which the voltage is instantaneously cut is obtained by applying a rectangular pulse indicated by I in FIG. 8. The applied voltage of the rectangular pulse I corresponds to the point C which is higher in voltage than the point B in the transition region in FIG. 7. It is desirable that the rectangular pulse width be 1 ns or more. A state in which the voltage is cut to about 0 is the region J shown in FIG. 8. The region J corresponds to the region around the point 0 in FIG. 7. In this case, when a low voltage indicated as a measurement voltage in FIG. 7 is applied, a current does not follow the curve D in FIG. 7 and has an extremely small current value. Specifically, the OFF state is obtained. A state L in which the voltage is cut is then obtained by applying a rectangular pulse indicated by K in FIG. 8. The applied voltage of the rectangular pulse K corresponds to a voltage around the threshold voltage lower than the point B in the transition region in FIG. 7. It is desirable that the pulse width of the rectangular pulse K be 100 ns or more. When a low voltage is applied in a region L and the current value is measured, a current follows the curve D in FIG. 7 (i.e., current flows through the element). Specifically, the ON state is obtained. The switching operation is possible since the element can be arbitrarily turned ON/OFF depending on the voltage applied before the voltage-cut operation.

When obtaining the ON state, the period in which the applied voltage is set at about the threshold voltage is important. Specifically, it is desirable that the period in which the applied voltage is set at about the threshold voltage be 100 ns or more. When this condition is satisfied, a triangular wave indicated by N in FIG. 8 may be used instead of the rectangular wave K in order to obtain the ON state. The triangular wave N must have a vertex at a voltage higher than the threshold value so that the triangular wave N crosses a voltage around the threshold voltage. The period in which the applied voltage is set to be higher than the threshold voltage is adjusted by adjusting a slope Q of the triangular wave N in FIG. 8. The ON state is obtained by adjusting the slope Q so that the period in which the applied voltage is set at about the threshold voltage is 100 ns or more. On the other hand, when the period of the triangular wave in which the applied voltage is set at about the threshold voltage is very short (in this case, it is desirable that the period in which the applied voltage is set at about the threshold voltage be 100 ns or less) (i.e., when a triangular wave M in FIG. 8 is applied), the element is turned OFF. Specifically, it is possible to use the triangular wave M instead of the rectangular wave I in order to obtain the OFF state. The value of the vertex of the triangular wave M is set at the point C in FIG. 7 in the same manner as the rectangular wave I. The period in which the applied voltage is set at about the threshold voltage is adjusted by adjusting the slope of the triangular wave M in a region P in FIG. 8.

The switching element 100 may be driven using various sequences other than the above-described rectangular wave and triangular wave.

5. Examples

As the insulating substrate 10, a silicon substrate coated with a silicon oxide layer with a thickness of 300 nm was used. The thickness of the first resist pattern was set at 1 micrometer. The first resist pattern was formed so that the width W1 of the first electrode lower portion 22 in the horizontal direction was 100 micrometers. The first electrode lower portion 22 was formed by depositing chromium on the insulating substrate 10 to a thickness of 2 nm and then depositing gold so that the total thickness was 25 nm. The angle θ1 during oblique deposition in the first deposition step was set at 75°. The thickness of the second resist pattern was set at 1 micrometer. The second resist pattern was formed so that the width W2 of the second electrode 30 in the horizontal direction was 2 micrometers. The second electrode 30 was formed by depositing chromium on the insulating substrate 10 to a thickness of 2 nm and then depositing gold so that the total thickness was 15 nm. Therefore, the total thickness of the first electrode 20 was about 40 nm. The angle θ2 during oblique deposition in the second deposition step was set at 60°. The second lift-off step was then carried out. Since the first electrode 20 and the second electrode 30 of the switching element 100 in this state were partially short-circuited, the short-circuited portion was removed by performing the electric field separation step. The electric field separation conditions were as follows. The applied voltage was 1 V, and the resistance of the resistor Rc was 100 ohms. The resistance of the variable resistor Rv was gradually decreased from 100 kilohms to 0 ohm so that the amount of current was gradually increased. The amount of current when electric field separation occurred was about 4 mA. The switching element 100 was thus obtained. The resulting switching element 100 was placed in a vacuum chamber. The pressure inside the vacuum chamber was about $10^{-5}$ Pa.

Figure 9A:
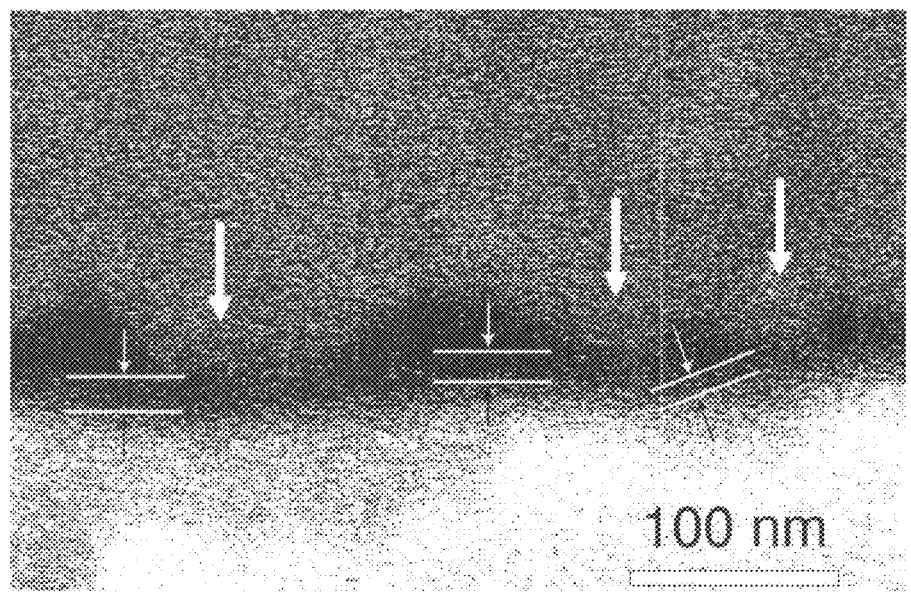
FIGS. 9A and 9B show a scanning electron microscopy result for an interelectrode gap 40 of a switching element 100 according to one embodiment of the invention, where
Figure 9B:
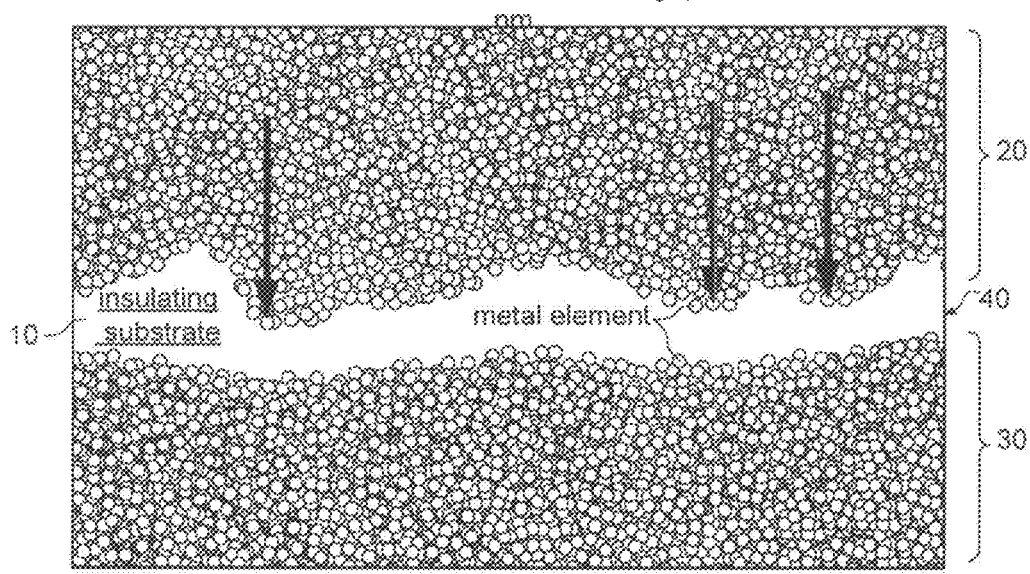

FIG. 9A shows an observation result for the switching element 100 according to this example using a scanning electron microscope. The switching element 100 was photographed at an accelerating voltage of 15 kV using a scanning electron microscope S-4300 (manufactured by Hitachi, Ltd.). The scanning speed was increased using a heating stage (resolution: about 5 nm). FIG. 9A shows part of the first electrode 20 (upper side), part of the second electrode 30 (lower side), and part of the interelectrode gap 40 (horizontally extending dark portion at the center of the photograph). As shown in FIG. 9A, the first electrode is positioned close to the second electrode at a plurality of points in the interelectrode gap 40. A downward bold arrow indicates a portion in which the electrodes are closely positioned. Two lines which indicate the width of the gap are drawn on the left of each arrow. The width of each gap was measured. The distance G between the first electrode 20 and the second electrode 30 in the observed area was about 8 nm. A portion in which the two electrodes of the switching element 100 are closely positioned may exist in an area other than the observed area. When the electrodes are positioned at a shorter distance, the distance cannot be measured due to the resolution of the microscope. The shortest distance between the electrodes was estimated from the resistance. The resistance between the electrodes was about 60 kilohms when the element was turned ON. Therefore, the shortest distance between the electrodes was at least 0.1 nm or more based on calculations from the tunneling effect. FIG. 9B is a simplified illustration based on the photograph shown in FIG. 9A. The first electrode 20 and the second electrode 30 are located on the insulating substrate 10 and are separated by the inter-electrode gap 40. The metal elements are drawn as spheres for ease of explanation. However, the sizes of the spheres are not necessarily drawn to scale. For example, the atomic radius of a chromium atom, which is one example type of metal element, may only be approximately 0.14 to 0.17 nm.

Figure 10:
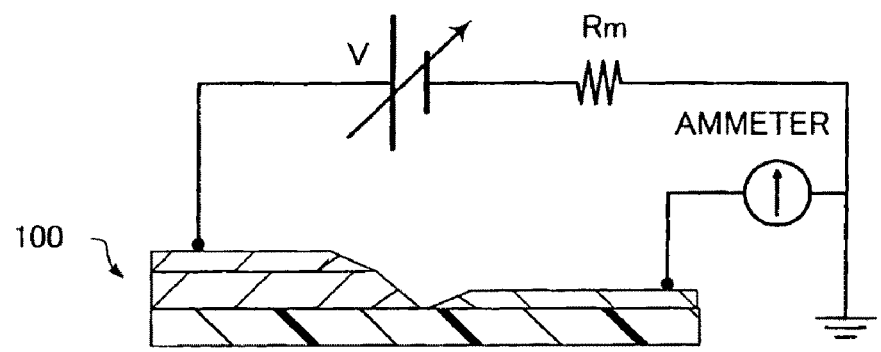
FIG. 10 is a circuit diagram schematically showing an operation verification/resistance measurement circuit for a switching element 100 according to one embodiment of the invention.
Figure 11:
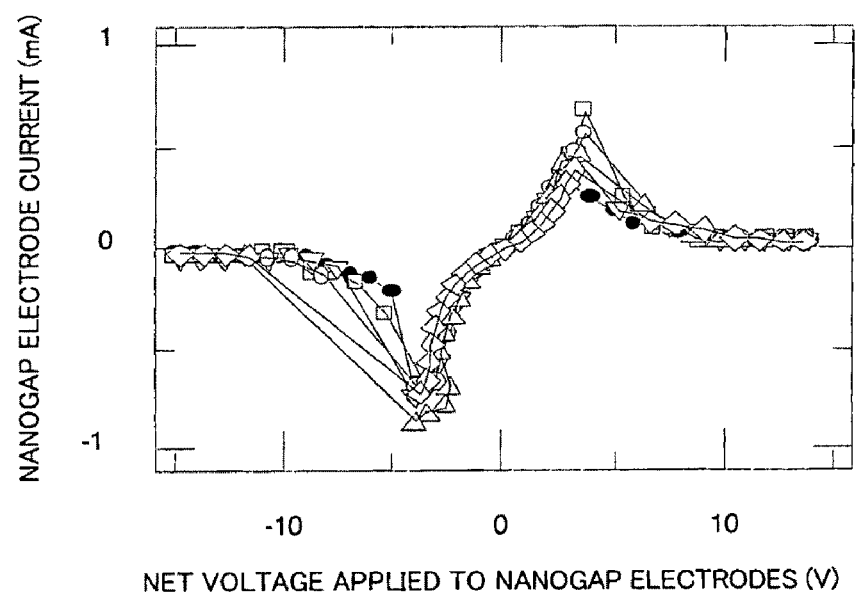
FIG. 11 is a graph showing current/voltage characteristic measurement results for a switching element 100 according to one embodiment of the invention.

FIG. 10 is a schematic view showing a circuit used to evaluate the element characteristics. The evaluation circuit was formed by connecting the switching element 100 to a micro-prober device in a vacuum chamber. FIG. 11 is a graph showing the measurement results for the I-V characteristics of the switching element 100 according to this embodiment using the circuit shown in FIG. 10. The horizontal axis of the graph shown in FIG. 11 indicates the net voltage applied to the switching element 100 obtained by subtracting voltage across the fixed resistor Rm from the circuit voltage. In FIG. 10, the vertical axis indicates a current which flows when applying each voltage measured using an ammeter. The I-V characteristics shown in FIG. 11 were measured as follows. The applied voltage was set at 0 V when starting the measurement. The applied voltage was swept to +15 V at a sweep rate of +0.2 V/s, swept to −15 V at a sweep rate of −0.2 V/s, and swept to +15 V at a sweep rate of +0.2 V/s. This cycle was repeated. FIG. 11 corresponds to FIG. 7.

In the I-V curve of the switching element 100 according to this embodiment shown in FIG. 11, the absolute value of the current is maximized when the applied voltage is +4 V and −4 V. The absolute value of the current rapidly decreases when the voltage is higher than +4 V. The absolute value of the current rapidly decreases when the voltage is lower than −4 V. The switching operation was performed as described in "4. Switching operation" utilizing this phenomenon. Specifically, a voltage (absolute value) of about 4 V was set to be the threshold voltage (corresponding to a point around the points A, B, E, and F in FIG. 7).

Figure 12:
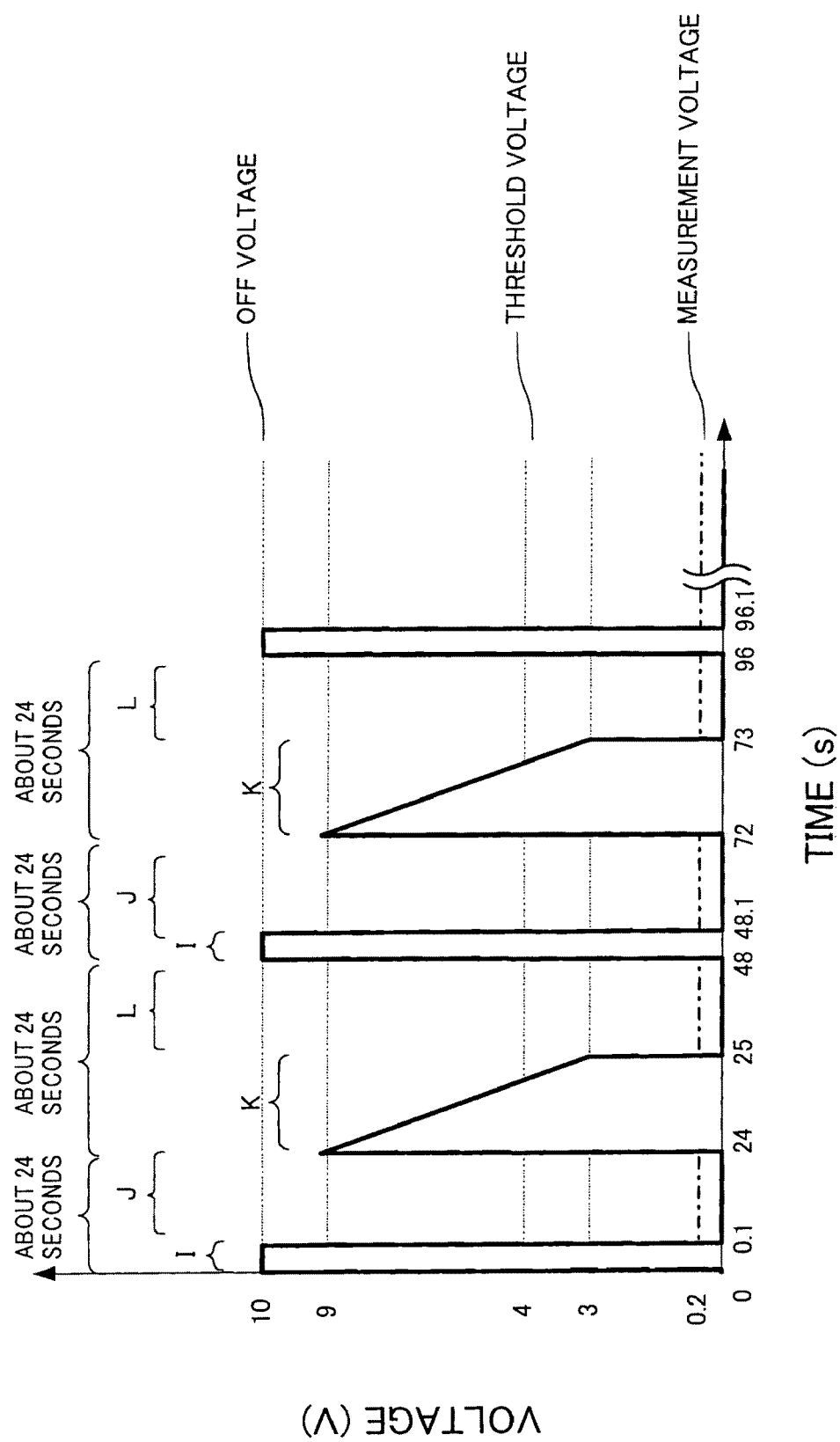
FIG. 12 is a graph schematically showing a repeated switching operation voltage sequence for a switching element 100 according to one embodiment of the invention.

FIG. 12 is a schematic view of the voltage sequence according to this example. In this example, the voltage of the pulse which causes the element to be turned OFF was set at +10 V. The voltage of the triangular wave which causes the element to be turned ON was swept from +9 V to +3 V and was cut at +3 V. As shown in FIG. 12, the rectangular pulse I at +10 V was applied for 100 ms, and the resistance was measured in the region J for about 24 seconds at a measurement voltage of +0.2 V. As indicated by the region K in FIG. 12, the voltage was swept from +9 V to +3 V over one second and then cut. The resistance was measured in the region L for about 24 seconds at a measurement voltage of +0.2 V. The resistance was measured by performing the above cycle 1000 times.

Figure 13:
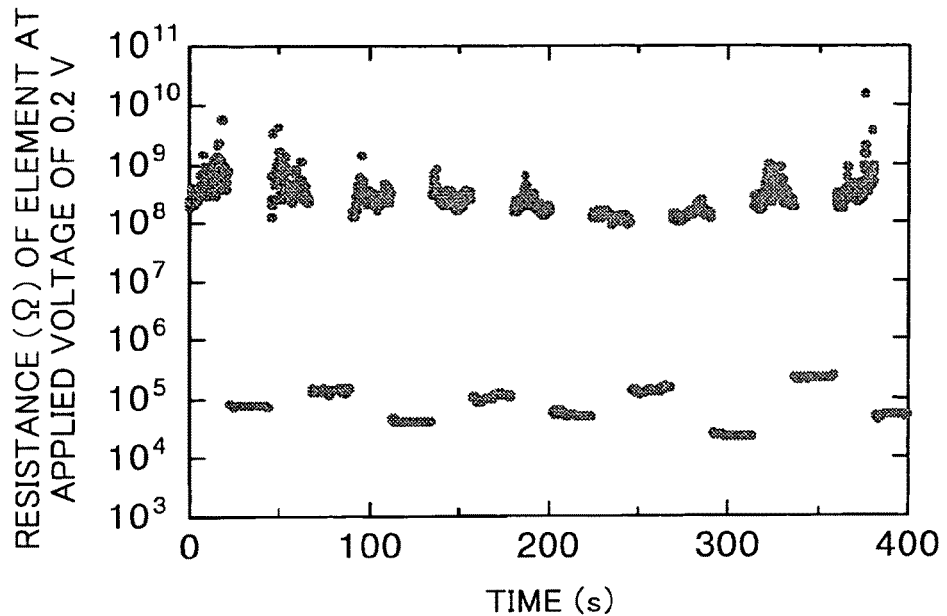
FIG. 13 is a graph showing the resistance of a switching element 100 according to one embodiment of the invention during repeated switching operations.

FIG. 13 shows part of the resistance measurement results according to this example. In FIG. 13, the horizontal axis indicates the elapsed time, and the vertical axis indicates the resistance when applying a voltage of +0.2 V. As shown FIG. 13, the resistance of the switching element 100 according to this embodiment in the ON state and the OFF state changed to only a small extent from the initial value during the repeated ON/OFF operations. The resistance in the ON state and the OFF state changed to only a small extent from the initial value even after the 1000-cycle measurements. Specifically, the resistance between the first electrode 20 and the second electrode 30 of the switching element 100 was 10 to 200 kilohms in the ON state and was 100 megaohms to 10 gigaohms in the OFF state.

This indicates that the switching element 100 can be arbitrarily turned ON/OFF depending on the voltage input from the outside. Since the ON/OFF state of the element can be maintained after applying the voltage pulse, even if the voltage is not applied, the switching element 100 is a nonvolatile switching element.

Figure 14:
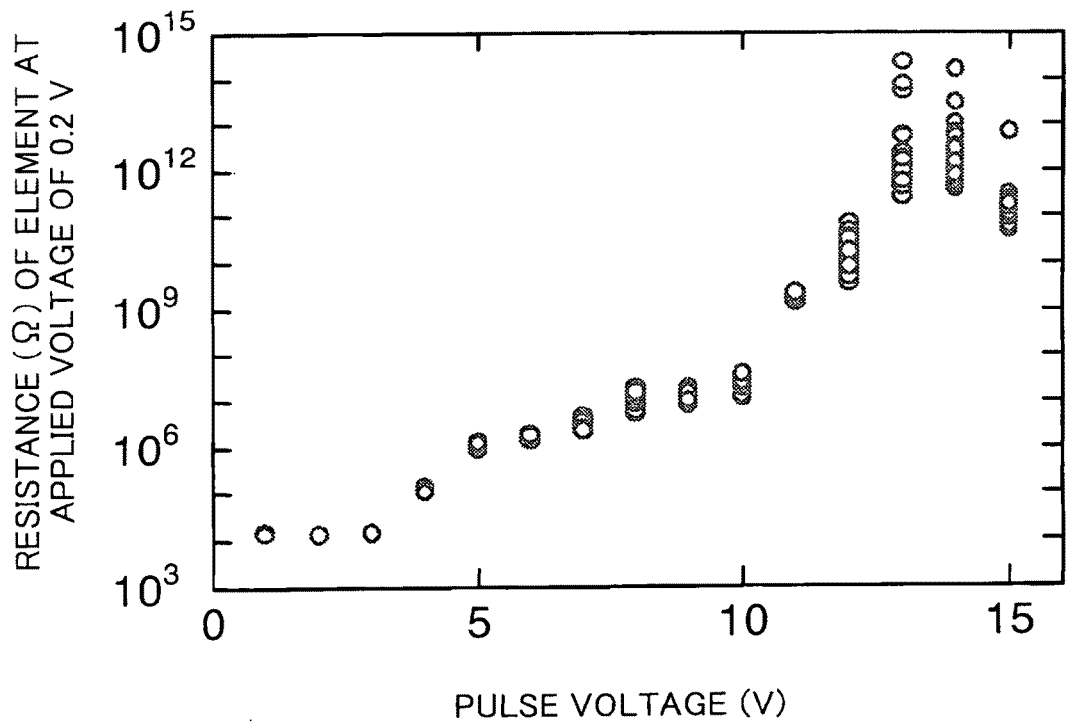
FIG. 14 is a graph showing the resistance of a switching element 100 according to one embodiment of the invention in the OFF state with respect to the voltage of an OFF pulse.

FIG. 14 is a graph in which the horizontal axis indicates the voltage of the pulse which causes the element to be turned OFF and the vertical axis indicates the resistance across the switching element 100 immediately after applying the pulse. With reference to FIG. 12, the horizontal axis of FIG. 14 indicates the voltage of the 100-ms rectangular pulse I and the vertical axis indicates the resistance measured in the region J during repeated measurements. As shown in FIG. 14, the resistance exceeds 1 megaohm when the voltage of the pulse exceeds about +5 V so that the OFF state is achieved. When the voltage of the pulse exceeds about +10 V, the resistance exceeds 10 gigaohms. When the voltage of the pulse exceeds about +13 V, the resistance exceeds 1 teraohm. Specifically, the switching element 100 is a switching element of which the resistance in the OFF state can be arbitrarily set depending on the voltage of the pulse which causes the switching element to be turned OFF. Since the ON state can obtained at about +4 V, the switching element 100 can be arbitrarily set in at least four resistance states. Specifically, the resistance can be set at 10 kilohms to 1 megaohm when the switching element is turned ON, and can be set at 1 megaohm to 100 teraohms when the switching element is turned OFF. The resistance of the switching element using the nanogap electrodes can be set at several to 100 kilohms in the ON state, and can be set at several hundred kilohms to several gigaohms in the OFF state, for example. It is possible to utilize the switching element as an element which can generate a relatively low resistance and a high resistance by arbitrarily selecting two states from these resistance states.

As described above, the switching element 100 according to this embodiment is a very simple switching element which does not use organic molecules, nanoparticles, and the like. Moreover, the switching element 100 can repeat switching operations in an extremely stable manner. Specifically, the switching element 100 according to this embodiment is a nonvolatile switching element which has a very simple structure and can perform stable and repeated switching operations.

The invention claimed is:

1. A switching element comprising:
   an insulating substrate;
   a first electrode arranged on a surface of the insulating substrate; and
   a second electrode arranged on the surface of the insulating substrate, wherein:
   a gap is present between the first electrode and the second electrode,
   a distance G is a closest distance across the gap between any point on the first electrode and any point on the second electrode,
   the distance G varies as metal elements, no smaller than an atom, of at least one of the first electrode and the second electrode move in response to a voltage being applied between the first and second electrodes, and
   the distance G remains less than 50 nm and greater than 0.1 nm.

2. The switching element as defined in claim 1, wherein the switching element is placed in an ON state by decreasing the distance G.

3. The switching element as defined in claim 2, wherein when the switching element is in the ON state, current flows between the first electrode and the second electrode via quantum tunneling.

4. The switching element as defined in claim 3, wherein when the switching element is in the OFF state, current flows between the first electrode and the second electrode via quantum tunneling.

5. The switching element as defined in claim 2, wherein the switching element is placed in an OFF state by increasing the distance G.

6. The switching element as defined in claim 5, wherein a resistance between the first electrode and the second electrode is approximately:
   1 kiloohm to 1 megaohm when the switching element is in the ON state, and
   1 megaohm to 100 teraohms when the switching element is in the OFF state.

7. The switching element as defined in claim 5, wherein the switching element is selectively placed in the OFF state by increasing the voltage being applied above a threshold voltage.

8. The switching element as defined in claim 7, wherein, after being placed in the OFF state, the switching element is maintained in the OFF state by decreasing the voltage being applied below the threshold voltage.

9. The switching element as defined in claim 8, wherein the switching element is selectively placed in the ON state by increasing the voltage being applied above the threshold voltage.

10. The switching element as defined in claim 9, wherein, after being placed in the ON state, the switching element is maintained in the ON state by decreasing the voltage being applied below the threshold voltage.

11. A switching element comprising:
an insulating substrate;
a first electrode provided on the insulating substrate; and
a second electrode provided on the insulating substrate to have an interelectrode gap between the first and second electrodes, a distance G between the first and second electrodes being 0 nm<G≦50 nm,
the distance G being changed by moving metal elements, no smaller than an atom, that form at least one of the first electrode and the second electrode by applying a first voltage between the first and second electrodes, wherein the first voltage is higher than a threshold voltage, and wherein G remains greater than zero such that separation between the first electrode and the second electrode is maintained;
a resistance between the first and second electrodes being set to a first resistance when the distance G is decreased;
the resistance between the first and second electrodes being set to a second resistance when the distance G is increased, wherein the second resistance is higher than the first resistance;
when the voltage applied between the first and second electrodes is changed from the first voltage to a second voltage and the resistance between the first and second electrodes is the first resistance, the resistance between the first and second electrodes is maintained at the first resistance, wherein the second voltage is lower than the threshold voltage;
when the voltage applied between the first and second electrodes is changed from the first voltage to the second voltage and the resistance between the first and second electrodes is the second resistance, the resistance between the first and second electrodes is maintained at the second resistance;
the resistance between the first and second electrodes being the first resistance when the switching element is in an ON state; and
the resistance between the first and second electrodes being the second resistance when the switching element is in an OFF state.

12. The switching element as defined in claim 11, wherein the distance G remains within 0.1 nm≈G≈20 nm.

13. The switching element as defined in claim 11, wherein a material for the first electrode is at least one material selected from gold, silver, platinum, palladium, nickel, aluminum, cobalt, chromium, rhodium, copper, tungsten, tantalum, carbon, and alloys thereof.

14. The switching element as defined in claim 11, wherein a material for the second electrode is at least one material selected from gold, silver, platinum, palladium, nickel, aluminum, cobalt, chromium, rhodium, copper, tungsten, tantalum, carbon, and alloys thereof.

15. The switching element as defined in claim 11, wherein at least one of the first electrode and the second electrode has a multilayer structure.

16. The switching element as defined in claim 11, wherein the first resistance is 1 kiloohm to 1 megaohm, and wherein the second resistance is 1 megaohm to 100 teraohms.

17. The switching element as defined in claim 11, further comprising:
a sealing member that encompasses at least the interelectrode gap.

18. The switching element as defined in claim 17, wherein a pressure inside the sealing member is $2\times10^5$ Pa or less.

19. The switching element as defined in claim 11, wherein when the switching element is in the ON state, current flows between the first electrode and the second electrode via quantum tunneling.

20. The switching element as defined in claim 19, wherein when the switching element is in the OFF state, current flows between the first electrode and the second electrode via quantum tunneling.

* * * * *

UNITED STATES PATENT AND TRADEMARK OFFICE
CERTIFICATE OF CORRECTION

| | | |
|---|---|---|
| PATENT NO. | : 8,093,518 B2 | Page 1 of 1 |
| APPLICATION NO. | : 11/992883 | |
| DATED | : January 10, 2012 | |
| INVENTOR(S) | : Yasuhisa Naitoh et al. | |

It is certified that error appears in the above-identified patent and that said Letters Patent is hereby corrected as shown below:

Column 4, Line 46, "(e.g., $0.1 \leq nm \leq G\ 20\ nm$)" should be --(e.g., $0.1\ nm \leq G \leq 20\ nm$)--.

Column 7, line 51, after "may" delete "be".

Column 8, Line 23, after "corresponds" insert --to--.

Column 11, Line 62, after "can" insert --be--.

Column 14, Line 5, Claim 12, "$0.1\ nm \sim G \sim 20\ nm.$" should be --$0.1\ nm \leq G \leq 20\ nm.$--.

Signed and Sealed this
Fifteenth Day of May, 2012

David J. Kappos
*Director of the United States Patent and Trademark Office*